US010615891B2

(12) United States Patent
Vaucher et al.

(10) Patent No.: US 10,615,891 B2
(45) Date of Patent: Apr. 7, 2020

(54) RECEIVER TESTING

(71) Applicant: NXP B.V., Eindhoven (NL)

(72) Inventors: Cicero Vaucher, Eindhoven (NL); Antonius De Graauw, Haelen (NL); Erwin Janssen, Deurne (NL)

(73) Assignee: NXP B.V., Eindhoven (NL)

( * ) Notice: Subject to any disclaimer, the term of this patent is extended or adjusted under 35 U.S.C. 154(b) by 233 days.

(21) Appl. No.: 15/707,068

(22) Filed: Sep. 18, 2017

(65) Prior Publication Data
US 2018/0152254 A1 May 31, 2018

(30) Foreign Application Priority Data
Nov. 28, 2016 (EP) ..................... 16201004

(51) Int. Cl.
H04B 17/21 (2015.01)
H03G 3/00 (2006.01)
H03G 3/30 (2006.01)
H04B 1/28 (2006.01)

(52) U.S. Cl.
CPC ............. H04B 17/21 (2015.01); H03G 3/001 (2013.01); H03G 3/3042 (2013.01); H03G 3/3078 (2013.01); H04B 1/28 (2013.01)

(58) Field of Classification Search
None
See application file for complete search history.

(56) References Cited

U.S. PATENT DOCUMENTS 8,620,248 B2 12/2013 Dehlink et al.
8,711,981 B2 4/2014 Dehlink et al.
2003/0138034 A1* 7/2003 Shi ........................ H03G 3/3042
375/219
2005/0221763 A1* 10/2005 Song ....................... H04B 17/21
455/67.11
2005/0227642 A1* 10/2005 Jensen ................ H04L 27/0014
455/127.1
2006/0128338 A1* 6/2006 Kerth ........................ H04B 1/28
455/285

(Continued)

OTHER PUBLICATIONS

Kim et al. "A 76-84-GHz 16-Element Phased-Array Receiver With a Chip-Level Built-In Self-Test System", IEEE Transactions on Microwave Theory and Techniques, vol. 61, No. 8, pp. 3083-3098 (Aug. 2013).

(Continued)

Primary Examiner — Clayton E. LaBalle
Assistant Examiner — Dennis Hancock
(74) Attorney, Agent, or Firm — Rajeev Madnawat

(57) ABSTRACT

Receivers and methods of testing are described. A receiver includes a plurality of receiver channels, each including an amplifier for receiving a signal from an antenna and a mixer downstream of the amplifier. A test signal generating circuit is configured to generate test signals. A signal path connects the test signal generating circuit and each receiver channel and couples to each receiver channel at a coupling between the amplifier and a mixer. A test signal from the test signal generating circuit is injectable to the parts of the receiver channel downstream of the amplifier. The test signal may alternatively be injected into the entire receiver channel. The receivers and methods may be used in wireless systems, such as radar systems and radio systems.

14 Claims, 4 Drawing Sheets

(56) References Cited

U.S. PATENT DOCUMENTS

2015/0207577 A1    7/2015   Delbecq et al.
2016/0077196 A1    3/2016   Dehlink et al.

OTHER PUBLICATIONS

Magner et al. "A 77GHz Automotive Radar Receiver in a Wafer Level Package", IEEE Radio Frequency Integrated Circuits Symposium, pp. 511-514 (2012).

* cited by examiner

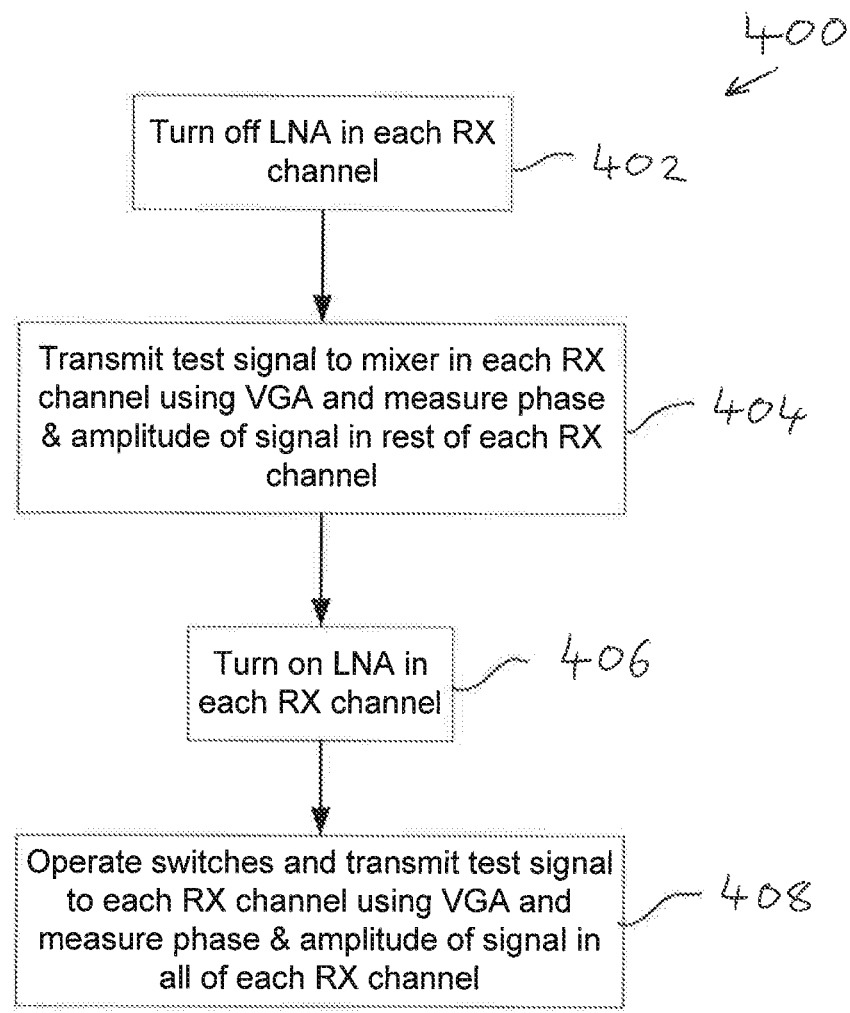

RECEIVER TESTING

CROSS-REFERENCE TO RELATED APPLOCATIONS

This application claims the priority under 35 U.S.C § 119 of European Patent application no. 16201004.5, filed on Nov. 28, 2016, the contents of which are incorporated by reference herein.

The present specification relates to testing receivers and in particular to testing receiver channels of a wireless receiver systems.

Wireless receiver systems with multiple antennae, are generally known and have a wide range of applications. For example, some radio receivers and some radar receivers have multiple antennae for various reasons. As well as determining the distance of a detected target more sophisticated radar systems can also determine the direction of a detected target.

For example, some radar systems may use digital beam forming on a number of receiver channels, to provide angle of arrival information for detected targets. To increase angular accuracy and resolution, the antenna aperture may be increased, while at the same time the angular field of view should not be reduced. One way of combining these competing requirements is to use electronic beam-forming and beam-steering techniques, either in the analog or digital electronics domains. Such electronic techniques may be preferred over mechanically-steered implementations that are more expensive and more prone to failure during the lifetime of a product.

In digital receiver beam forming, a plurality of receiver channels may be used, each comprising a complete receive chain, from a receiver antenna down to digital output signals. Initial phase and amplitude differences in the different receiver channels can be measured during assembly of the wireless system, and these differences can then be "calibrated-out" by suitable data processing by a digital signal processing stage of the wireless system.

However, if variations in the receiver amplitude and/or phase response occur during the lifetime of the product, then the initial calibration coefficients will no longer be accurate, resulting in decreased angular measurement performance of the wireless system.

Further, for wireless systems used in applications having functional safety requirements, any deterioration in performance must be detected by the system. After detection of a sufficient decrease in performance, the end-user of the system may be notified of the problem and a solution can be put in place. This may be replacement of the sensor which includes the receiver channels, or a re-calibration procedure, etc.

Hence, reliable techniques for measuring variations in the amplitude and phase response of receiver channels of a wireless system would be beneficial.

According to a first aspect of the present disclosure, there is provided a receiver for a wireless system comprising: a plurality of receiver channels, each receiver channel including an amplifier for receiving a signal from a respective antenna and a mixer arranged downstream of the amplifier, and wherein each amplifier has an input for receiving a control signal to turn the amplifier on or off; a test signal generating circuit configured to generate test signals; a signal path connecting the test signal generating circuit and each receiver channel of the plurality of receiver channels, and wherein the signal path couples to each receiver channel at a coupling between a respective amplifier and a respective mixer so that a test signal from the test signal generating circuit is injectable to the parts of the receiver channel downstream of the amplifier for each of the plurality of receiver channels when the amplifier of a receiver channel is turned off.

Injecting a test signal at the input of the mixer of each receiver channel when the amplifier is turned off may help improve the reliability of measurement of the amplitude and/or phase of the signals in each receiver channel.

In one or more embodiments, the signal path couples to each receiver channel at a further coupling upstream of a respective amplifier so that a test signal from the test signal generating circuit is injectable to the entire receiver channel for each of the plurality of receiver channels when the amplifier of a receiver channel is turned on.

In one or more embodiments, the signal path may comprise a first transmission line which is coupled to each of the receiver channels.

In one or more embodiments, the first transmission line may include a plurality of switches, and wherein a respective one of the plurality of switches may be provided for each respective receiver channel of the plurality of receiver channels, and wherein each switch may be arranged to selectively connect the first transmission line to the coupling or the further coupling.

In one or more embodiments, the signal path may further comprise a second transmission line which is coupled to each of the receiver channels, and wherein the first transmission line may include the further coupling for each receiver channel and the second transmission line may include the coupling for each receiver.

In one or more embodiments, the test signal generating circuit may include a first output which may be connected to the first transmission line and/or a second output which may be connected to the second transmission line.

In one or more embodiments, the test signal generating circuit may be configured to generate a single-sideband modulated test signal.

In one or more embodiments, the test signal generating circuit may include a single-sideband modulator and/or an in-phase and quadrature direct digital frequency synthesizer.

According to a second aspect of the present disclosure, there is provided a package including an integrated circuit, wherein the integrated circuit is configured to provide the receiver of the first aspect, and also any preferred features thereof.

In one or more embodiments, the package may be a radio receiver integrated circuit. The radio receiver may be a mm wavelength radio receiver.

In one or more embodiments, the package may be a radar sensor integrated circuit.

According to a third aspect of the present disclosure, there is provided a wireless system including the receiver of the first aspect or the package of the second aspect. The wireless system may be a radio system or a radar system.

In one or more embodiments, the radar system may be an automotive radar system.

According to a fourth aspect of the present disclosure, there is provided a method of testing a receiver comprising a plurality of receiver channels, each receiver channel including an amplifier for receiving a signal from a respective antenna and a mixer arranged downstream of the amplifier, the method comprising, for each receiver channel: turning off the amplifier in a receiver channel; injecting a test signal into the receiver channel between the amplifier and the mixer while the amplifier is turned off; and measuring the amplitude and phase of the signal transmitted down the receiver channel.

In one or more embodiments, the method may further comprise, for each receiver channel: turning on the amplifier in the receiver channel; injecting a further test signal into the receiver channel upstream of the amplifier while the amplifier is turned on; and determining the amplitude and phase of the signal transmitted down the receiver channel.

Features of the first aspect may also be counterpart features for the fourth aspect.

Embodiments of the invention will now be described in detail, by way of example only, and with reference to the accompanying drawings, in which:

FIG. 4 shows a schematic process flow chart illustrating a second example method of operation of the second example receiver part of a wireless system shown in FIG. 3.

Similar items in the different Figures share like reference signs unless indicated otherwise.

Apparatus and methods for reliably testing the receiver channels or chains of a wireless system will be described below. The following description uses a radar receiver for a radar system as a particular example. However, the same approach can be applied to any type of receiver for a wireless system which includes multiple receiver antenna channels or chains, such as various radio systems, including mm wave radio systems. In the following, the example system of an automotive radar system will be used but it will be appreciated that the approach can be applied to other radar systems and generally to other wireless systems as well. Also, the following description will be in the context of a radar sensor in the form or an integrated circuit, but it will be appreciated that the approach can also be applied to other specific implementations of a wireless receiver.

Figure 1:
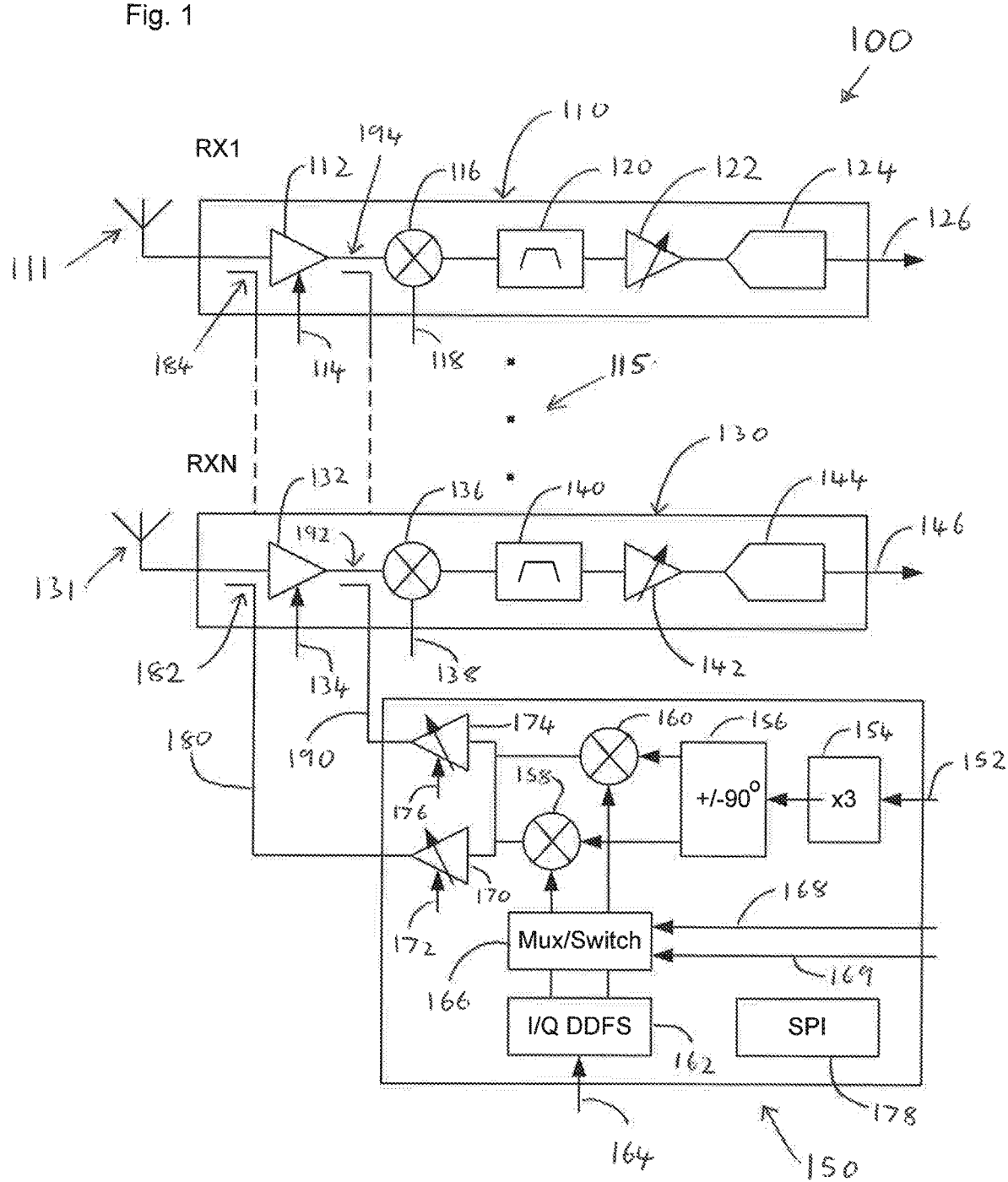
FIG. 1 shows a schematic block diagram of a first example receiver part of a wireless system.

With reference to FIG. 1 there is shown a schematic block diagram of a first example part of a wireless system 100. The part of the wireless system 100 includes a plurality of receiver channels, RX1 to RXN. It will be appreciated that although only two receiver channels are illustrated in FIG. 1, a greater number of receiver channels can also be provided, as indicated by dots 115.

Each receiver channel has generally the same construction. The first receiver channel 110, RX1, is attached to a first receiver antenna 111. The receiver channel or chain 110 includes a low noise amplifier 112 which can be turned on or off by a control signal 114. The low noise amplifier 112 is connected to a first input of a mixer 116, the second input of which is arranged to receive a local oscillator signal 118. An intermediate frequency signal is output from mixer 116 to a filter 120, which may be a band pass filter. The output of filter 120 is connected to a variable gain amplifier 112 the output of which is connected an analogue to digital converter 124 which outputs a digital signal 126 to the remainder of the system.

As will be appreciated by a person of ordinary skill in the art, depending on the field of application of the wireless system, for example as a radio system or a radar system, various other components are typically provided, including one or more data processing devices for carrying out various data processing operations on the digital data received from the receiver channels. In particular, the data processing devices may be configured by a suitable software control the overall operation of the wireless system and to carry out the initial testing of the receiver channels and subsequent measurements of the amplitude and phase of the signal in each receiver channel to allow further calibration of the receiver channels through ongoing use of the product. Also, the antennae 111, 132 may be adapted to be suitable for the properties of the electromagnetic signal that they are intended to detect, e.g. wavelength, polarisation, modulation, etc.

An array of received data for each RX channel can be captured and processed using a fast Fourier transform (FFT) in a baseband digital processor, to obtain phase and amplitude information of the down-converted IF signals on each RX channel, using a common test signal provided by the test signal generation 150. The calculated values of amplitude and phase on each channel are then compared in the baseband processor unit to reference values obtained at end-of-line measurements on each channel. A deviation larger than a given value with respect to the end-of-line reference values can then be flagged by the sensor digital processor unit as an unsafe situation to a system controller.

Each of the plurality of receiver channels has generally the same construction. For example, the $n^{th}$ receiver channel RXN, 130, is similarly connected to a receiver antenna 131 which in turn is connected to a low noise amplifier 132 which can also be turned on and off by a control signal 134. The output of low noise amplifier 132 is connected to an input of mixer 136 which also receives a local oscillator signal on a second input 138. The intermediate frequency output of the mixer 136 is passed to the band pass filter 140 the output of which is passed to variable gain amplifier 142 the output of which is passed to analogue to digital converter 144 resulting in output digital data 146 which is passed to the data processing components of the system.

A test signal generation circuit 150 is also provided. The test signal generation circuit 150 generates a single-sideband (SSB) test signal and is built around an SSB modulator and an in-phase/quadrature direct digital frequency synthesizer (I/Q DDFS). The DDFS may be implemented, for example, by a cascade of programmable frequency dividers arranged to output the desired in-phase (I) and quadrature (Q) signals to quadrature mixers 158, 160. The frequency of the test signal can be altered by changing the division ratio of the frequency dividers.

More particularly, the test circuit 150 has a first input 152 for receiving the local oscillator signal of the radar system, e.g. at 26 GHz. A frequency multiplier block 154 increases the frequency of the local oscillator signal by a factor of 3 and is connected to a phase shifting element 156 which is configured to introduce a 90° phase shift between its respective output signals. A first output signal is supplied to a first mixer 158 and a second output signal shifted by 90° relative to the first signal, is output to a second mixer 160. An in phase/quadrature direct digital frequency synthesizer (I/Q DDFS) 162 receives a system clock signal 164 at an input and outputs an in-phase and a quadrature signal on respective outputs. The outputs of the I/Q DDFS 162 are supplied to a multiplexer or switching device 166 which receives as first inputs the in phase (I) and quadrature (Q) signals from I/Q DDFS 162, and as a second input a first in-phase sine wave signal 168 and a second quadrature sine wave signal 169 from an external source.

The two outputs of the I/Q DDFS 162 or the two external sine wave signals 168 and 169 can be selected at multiplexer 166 by an SPI selection bit. The outputs of the I/Q DDFS 162 are generally square waves which can be used during lifetime tests, whereas the sine wave inputs 168 and 169 are used during a final test of the radar IC for linearity assessment of the receiver paths 110, 130. Hence, switching device 166 is operable to supply in-phase (I) and quadrature (Q) sine waves 168 and 169 to mixers 158 and 160 during a final test stage and then later on switching device 166 is operable to supply I and Q signals instead from DDFS 162 to the mixers 158 and 160 during BIST.

The in phase signal, I, is supplied to the first mixer 158 and the quadrature signal, Q, is supplied to the second mixer 160.

The test signal generation circuit 150 also includes a first variable gain amplifier 170 which can be turned on or off by a control signal 172 and whose input receives the combined outputs of the first mixer 158 and the second mixer 160. Similarly, a second variable gain amplifier 174 is provided and is controllable by a control signal 176 to turn on or off and can also receive the combined outputs of the first 158 and second 160 mixers at its input.

The test signal generator circuit 150 also includes a serial peripheral interface 178 via which the test signal generating circuit 150 can communicate with other parts of the radar system over a serial peripheral interface bus.

A first transmission line 180 is connected to the first output of the test signal generation circuit 150 and is coupled to each of the receiver channels 110, 130 before the respective low noise amplifiers 112,132, at the antenna connection line. The transmission line 180 is capacitively coupled at 182, 184 with a weak coupling level, for example S21 approximately −26 dB.

A second transmission line 190 is provided and connected to a second output of the test signal generator circuit 150 and coupled to each of the receiver channels 110, 130. The second transmission line 190 is coupled to the receiver channel downstream of the low noise amplifier and before the mixer, at the mixer input. Again, the second transmission line is capacitively coupled at 192, 194 with a weak coupling level of, for example, S21 approximately minus 26 dB. The first and second transmission lines provide a signal path by which test signals can be injected into each of the receiver channels and at the same positions in each of the receiver channels 110, 130.

Hence, the test signal generator circuit 150 can generate test signals and has two separate outputs driven by two switchable amplifiers 170,174 to two separate distribution transmission lines towards the receiver channel 110. A first test signal is coupled in front of the low noise amplifier, to the antenna connection line, and a second test signal is coupled between the low noise amplifier and the mixer 116, 136, at the mixer input. The test signal generating circuit 150 provides a built in self-test (BIST) functionality for the radar receiver 100 as described in greater detail below.

Figure 2:
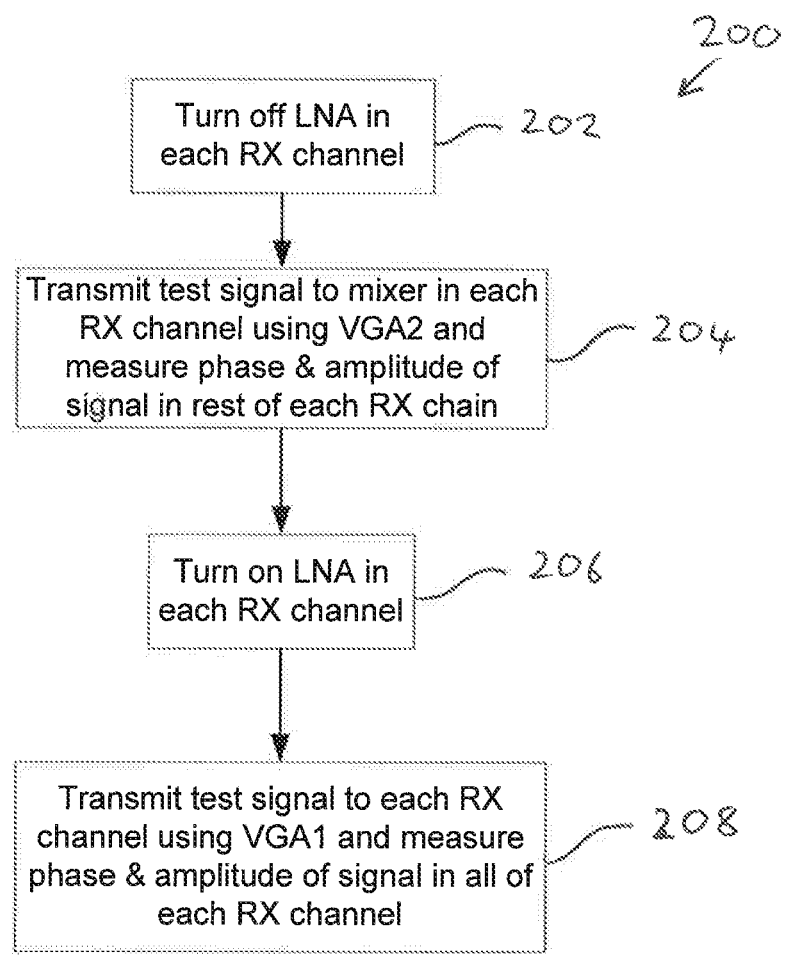
FIG. 2 shows a schematic process flow chart illustrating a first example method of operation of the receiver part of the wireless system shown in FIG. 1.

The method of operation of the apparatus 100 illustrated in FIG. 1 will now be described with further reference to FIG. 2. FIG. 2 shows a flowchart illustrating a method of operation 200 of the receiver apparatus 100 illustrated in FIG. 1.

Any antenna reflection signal or external interferences can interfere with the sensitive receiver phase measurements. Hence, at 202, the low noise amplifier 112,132 is turned off in each of the receiver channels by asserting control signals 114,134. The variable gain amplifier 170 is turned off by asserting control signal 172 and the variable gain amplifier 174 is turned on by asserting control signal 176. Hence, at 204, a test signal is transmitted from test signal generator circuit 150 by transmission line 190 and injected into the receiver chain downstream of the low noise amplifiers 112,134 and at the input to the mixers 116, 136. The phases and amplitudes of the test signals transmitted down the remainder of the receiver channels 110, 130 are measured and phase differences and amplitude differences in the receiver channels 110, 130 can then be determined by the baseband signal processor based on the transmitted test signal. As the low noise amplifiers 112,132 are switched off, these provide reverse isolation toward the antenna and hence signals arising from antenna reflection or other external interference sources are reduced or eliminated. Also, the test signal is directly injected in the input of the mixers 116,136.

At 206, the low noise amplifier 112,132, in each receiver channel is turned on by asserting control signals 114, 134. Variable gain amplifier 174 is turned off by asserting control signal 176 and variable gain amplifier 170 is turned on by asserting control signal 172. The test signal generating circuit 150 is controlled to output a test signal at 208 having similar properties to that used at 204 (but possibly with a different amplitude as controlled by the gain of amplifier 170 and control signal 172) which allows the complete receiver path to be functionally tested as the low noise amplifiers 112,132 are on and the test signal is applied at the input 182,184 of each receiver channel at 208. The phase and amplitude of the test signals transmitted down the entirety of each receiver channels are measured and any differences in phase and/or amplitude can be determined.

The test signal supplied by transmission line 180 to the inputs of the LNAs 112, 132 effectively has a frequency offset with respect to the signals 118, 138 applied to the second inputs of the mixers 116, 136. The signals 118, 138 input to mixers 116, 138 are the same as the local oscillator signal 152. The respective output signals of the mixers 116, 136 have a frequency equal to the frequency of the signal applied by the I/Q DDFS signal generator 162 to mixers 158 and 160 via switchable multiplexer 166. The respective output signals of the mixers 116, 136 are subsequently digitized by respective ADCs 124, 144 and transferred to a baseband signal processor of the system. The baseband signal processor then performs a fast Fourier transform (FFT) signal analysis on a sets of data points supplied by the ADCs 124, 144. As the test signals applied to all RX channels 110, 130 from transmission line 180 have a consistent amplitude and phase relationship, successive FFT analyses on several RX channels should provide consistent and stable results during the product lifetime. Otherwise the baseband signal processor, can raise a flag, or other error message or signal, to indicate a deviation from initial calibrated amplitude and phase responses or expected amplitude and phase responses.

Further, the same single test signal is used to test all the receiver channels 110,130 and so no random sources of phase errors are introduced in the testing network. Only systematic phase, and possibly some amplitude, errors may arise due to transmission line length differences owing to the different coupling positions 192, 194 for each of the receiver channels.

Hence, this approach can be used more accurately to assess the gain and amplitude match, or mismatch, between the different receiver channel paths during the lifetime of the receiver. The initial systematic phase and amplitude errors of the different receiver channels can be determined using pilot test signals before a receiver and system is provided to an end user. Then, during the life time of the system, the test signal generating circuit 150 can be used by the system as a BIST circuit to evaluate any changes in the gain and phase behaviour of each receiver channel.

It will be appreciated that in other embodiments steps 206 and 208 can be performed before steps 202 and 204.

Figure 3:
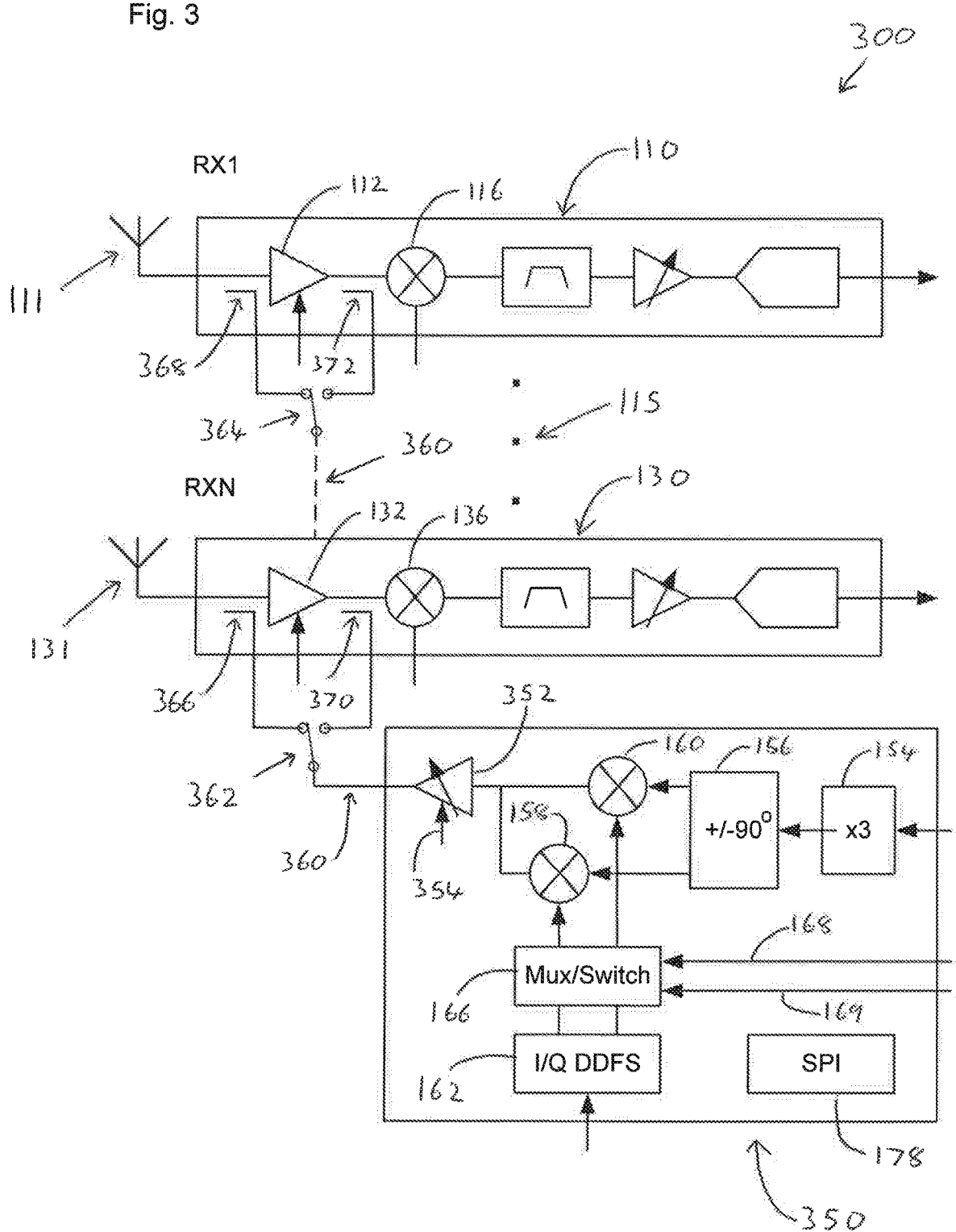
FIG. 3 shows a schematic block diagram of second example receiver part of a wireless system.

FIG. 3 shows a schematic block diagram of a second example receiver part 300 of a wireless system which is generally similar to the first example 100 shown in FIG. 1. Many of the parts are similar and are numbered similarly.

However, there are some differences in the test signal generating circuit 350 and also the signal path used to distribute the test signals to the multiple receiver channels 110, 130.

The test signal generator circuit 350 includes only a single variable gain amplifier 352 which can be turned on or off by control signal 354. Amplifier 352 is turned off during normal system operation and turned on during BIST self-test operation.

The test signal path is provided by a single transmission line 360 connected to the output of the test signal generating circuit 350 and arranged to distribute the test signals to the multiple receiver channels 110,130. The signal transmission line 360 communicates with a respective switching device 362,364 associated with each receiver channel 110,130. Each switching device 362,364 includes respective first and second transmission line segments coupled upstream of the low noise amplifier 366,368 and coupled to the input of the mixer 370,372 respectively.

Hence, the system is generally similar to that shown in FIG. 1 other than switching devices 362,364 being used to selectively switch test signals from the test signal generating circuit 350 over a single transmission line alternatively to the upstream side of the low noise amplifier or to the input of the mixer for each of the receiver channels 110,130.

This implementation is more compact than that shown in FIG. 1 from the point of view of hardware. However, the switches 362,364 may introduce systematic differences, leading to a source of measurement inaccuracy and therefore may be less preferable than the implementation shown in FIG. 1, but still of significant benefit compared to other approaches. Hence, the implementation 300 shown in FIG. 3 may be more appropriate where size of the implementation is a more important factor than accuracy of measurement.

The method of operation of the apparatus shown in FIG. 3 is illustrated by the flow chart shown in FIG. 4. The method of operation 400 is generally similar to the method of operation 200, illustrated in FIG. 2.

At 402, the low noise amplifiers 112,132 are turned off by asserting control signal 114,134. The switches 362,364 are operated, if needed, to switch to a first configuration to connect the transmission line 360 to the coupling 370,372 to inject the test signal directly to the input of the mixer 116,136 of each receiver channel. The test signal generator circuit 350 is then operated 404 to output the test signal over the transmission line 360 which is injected into each receiver channel 110, 130 at the input of the respective mixers 116,136 and along the rest of each receiver channel. The phase and amplitude of the test signals transmitted down the rest of each receiver channel are measured and determined by the base band signal processor at 404.

Hence, similarly to the first method of operation, switching off the low noise amplifier provides reverse isolation toward the antenna, helping to improve the accuracy of phase measurement by reducing or eliminating any antenna reflection signal or other external interference sources.

At 406, the low noise amplifier 112,132 in each receiver channel 110,130 is turned on. The switches 362,364 are operated to switch to a second configuration, in which the test signal is transmitted 408 to each of the receiver channels using amplifier 352 of test signal generator circuit 350 over the common single transmission line 360 and the phase and amplitude of the test signals transmitted down all of each receiver channel are measured and determined by the base band signal processor at 408.

Similarly to the method illustrated in FIG. 2, in other embodiments, steps 406 and 408 of method 400, can be performed before steps 402 and 404.

The apparatus and methods described above may help to address a number of issues which may arise if other approaches to assessing the performance of multiple receiver channels were used.

If the test signals were coupled directly to the RF input node of the receiver channel, which is also coupled to the antenna, then any imperfect matching condition at the antenna port will reflect the test signal from the antenna back into the mixer. Hence, the test signal would not be accurate anymore, but rather a combination of the intended test signal with the reflected components of the test signal. The resulting test signal would be a combined signal having an amplitude error and a phase error which would degrade the measurement accuracy, and therefore the confidence level of the receiver channel measurements.

Also, the test signal can "leak" out of the antennas into the environment, and would be reflected back by any radome, or would couple to other receiver antenna ports owing to the finite receiver isolation between receiver antennas, which may be typically on the order of 30 dB. Hence, each receiver port will receive a number of undesired signals owing to the other receiver ports, further decreasing the accuracy of the receiver channel amplitude measurement and phase measurement.

Further, during receiver channel measurement, an external radar, or other source of transmitted radio signals, can become a source of measurement interference if the antenna is directly coupled to the mixer during the test signal injection. This effect may also disturb the measurement and lead to false positives in the detection algorithms. For example, a phase or amplitude deviation may be flagged but the error would be owing to an external interfering signal rather than a problem with the receiver channel.

Hence, the receiver channel testing circuits and methods described herein may provide a more reliable way of measuring the amplitude and phase performance of receiver channels in a wireless system.

In some embodiments, the receivers with built in self-testing (BIST) illustrated in FIGS. 1 and 3 can be provided in the form of an integrated circuit in a package. In particular the receivers may be provided as a radar sensor integrated circuit which may be particularly suitable for use in RF radar systems, such as automotive radar system.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Any instructions and/or flowchart steps can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

While the disclosure is amenable to various modifications and alternative forms, specifics thereof have been shown by way of example in the drawings and described in detail. It should be understood, however, that other embodiments, beyond the particular embodiments described, are possible as well. All modifications, equivalents, and alternative embodiments falling within the scope of the appended claims are covered as well.

The invention claimed is:

1. A receiver for a wireless system comprising:
a plurality of receiver channels, each receiver channel including an amplifier for receiving a signal from a respective antenna and a mixer arranged downstream of the amplifier, and wherein each amplifier has an input for receiving a control signal to turn the amplifier off or on;
a test signal generating circuit configured to generate test signals;
a signal path connecting the test signal generating circuit and each receiver channel of the plurality of receiver channels, and wherein the signal path couples to each receiver channel at a coupling between a respective amplifier and a respective mixer so that a test signal from the test signal generating circuit is injectable to the parts of the receiver channel downstream of the amplifier for each of the plurality of receiver channels when the amplifier of a receiver channel is turned off.

2. The receiver for a wireless system as claimed in claim 1, wherein the signal path couples to each receiver channel at a further coupling upstream of a respective amplifier so that a test signal from the test signal generating circuit is injectable to the entire receiver channel for each of the plurality of receiver channels when the amplifier of a receiver channel is turned on.

3. The receiver for a wireless system as claimed in claim 1, wherein the signal path comprises a first transmission line which is coupled to each of the receiver channels.

4. The receiver for a wireless system as claimed in claim 3, wherein the signal path further comprises a second transmission line which is coupled to each of the receiver channels, and wherein the first transmission line includes the further coupling for each receiver channel and the second transmission line Includes the coupling for each receiver.

5. The receiver for a wireless system as claimed in claim 4, wherein the test signal generating circuit includes a first output which is connected to the first transmission line and a second output which is connected to the second transmission line.

6. The receiver for a wireless system as claimed in claim 1, wherein the first transmission line includes a plurality of switches, and wherein a respective one of the plurality of switches is provided for each respective receiver channel of the plurality of receiver channels, and wherein each switch is arranged to selectively connect the first transmission line to the coupling or the further coupling.

7. The receiver for a wireless system as claimed in claim 1, wherein the test signal generating circuit is configured to generate a single-sideband modulated test signal.

8. The receiver for a wireless system as claimed in claim 7, wherein the test signal generating circuit includes a single-sideband modulator and an in-phase and quadrature direct digital frequency synthesizer.

9. A package including an integrated circuit, wherein the integrated circuit is configured to provide the receiver of claim 1.

10. A wireless system including the receiver of claim 1.

11. The wireless system as claimed in claim 10, wherein the wireless system is a radar system.

12. The wireless system as claimed in claim 10, wherein the wireless system is a mm wavelength radio system.

13. A method of testing a receiver comprising a plurality of receiver channels, each receiver channel including an amplifier for receiving a signal from a respective antenna and a mixer arranged downstream of the amplifier, the method comprising, for each receiver channel:
turning off the amplifier in a receiver channel;
injecting a test signal into the receiver channel between the amplifier and the mixer while the amplifier is turned off; and
determining the amplitude and phase of the signal transmitted down the receiver channel.

14. The method of claim 13, further comprising, for each receiver channel:
turning on the amplifier in the receiver channel;
injecting a further test signal into the receiver channel upstream of the amplifier while the amplifier is turned on; and
determining the amplitude and phase of the signal transmitted down the receiver channel.

* * * * *